United States Patent
Chye et al.

(10) Patent No.: US 9,053,720 B1
(45) Date of Patent: Jun. 9, 2015

(54) HIGH MOMENT WRAP SHIELDS FOR MAGNETIC READ HEAD TO IMPROVE MICRO-MAGNETIC READ WIDTH

(71) Applicant: Headway Technologies, Inc., Milpitas, CA (US)

(72) Inventors: Yewhee Chye, Hayward, CA (US); Kunliang Zhang, Fremont, CA (US); Min Li, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 14/152,433

(22) Filed: Jan. 10, 2014

(51) Int. Cl.
  *G11B 5/39* (2006.01)

(52) U.S. Cl.
  CPC ............ *G11B 5/3912* (2013.01); *G11B 5/3906* (2013.01)

(58) Field of Classification Search
  CPC .............. G11B 5/10; G11B 5/11; G11B 5/39; G11B 5/3906; G11B 5/3909; G11B 5/3912
  USPC ............ 360/319, 320, 324.1, 324.11, 324.12, 360/324.2
  See application file for complete search history.

(56) References Cited

U.S. PATENT DOCUMENTS

| | | | |
|---|---|---|---|
| 7,450,349 B2 | 11/2008 | Nishida et al. | |
| 7,599,153 B2 | 10/2009 | Lin | |
| 7,606,009 B2 | 10/2009 | Lin | |
| 8,482,883 B2 * | 7/2013 | Dimitrov et al. | 360/324.2 |
| 8,630,068 B1 * | 1/2014 | Mauri et al. | 360/319 |
| 8,711,526 B2 * | 4/2014 | Colak et al. | 360/319 |
| 2005/0157431 A1 * | 7/2005 | Hatatani et al. | 360/319 |
| 2006/0067005 A1 * | 3/2006 | Jayasekara | 360/319 |
| 2011/0007429 A1 * | 1/2011 | Dimitrov et al. | 360/319 |
| 2012/0087046 A1 * | 4/2012 | Yanagisawa et al. | 360/294 |
| 2012/0250189 A1 * | 10/2012 | Degawa et al. | 360/235.4 |
| 2012/0281319 A1 * | 11/2012 | Singleton et al. | 360/319 |
| 2014/0049857 A1 * | 2/2014 | Isowaki et al. | 360/244 |
| 2014/0153138 A1 * | 6/2014 | Le et al. | 360/294 |
| 2014/0293474 A1 * | 10/2014 | Yamane et al. | 360/75 |

OTHER PUBLICATIONS

Co-pending U.S. Appl. No. 13/785,227, filed Mar. 5, 2013, "Thin Seeded Antiferromagnetic Coupled Side Shield for Sensor Biasing Applications," by Kunliang Zhang, et al., 31 pgs.
Co-pending U.S. Appl. No. 13/785,255, filed Mar. 5, 2013, "High Moment Wrap-Around Shields for Magnetic Read Head Improvements," by Kunliang Zhang, et al., 38 pgs.
Co-pending U.S. Appl. No. 13/803,362, filed Mar. 14, 2013, "A Reader Sensor Structure and Its Method of Construction," by Min Li, et al., 39 pgs.
Co-pending U.S. Appl. No. 13/865,269, filed Apr. 18, 2013, "Supermalloy and Mu Metal Side and Top Shields for Magnetic Read Heads," by Yewhee Chye, et al., 12 pgs.

* cited by examiner

*Primary Examiner* — Jefferson Evans
(74) *Attorney, Agent, or Firm* — Saile Ackerman LLC; Stephen B. Ackerman (57) ABSTRACT

A magnetically stable, read sensor uses low-coercivity magnetic material without seed layers in side shields for longitudinal biasing in order to improve micro-magnetic read width of the sensor. The sensor is formed between an upper and lower shield and includes a symmetric pair of abutting side shields adjacent to the sides of the sensor. In one configuration the side shields are partially covered by a layer of high magnetic moment material that extends along a bottom surface and side surface of the side shields and is contiguous and conformal with the layer of insulating material, but does not cover the backside of the sensor. The high moment layer focuses flux at the sensor sides and also improves the micro-magnetic read width. The side shields include a multiplicity of horizontal ferromagnetic layers that are antiferromagnetically coupled to each other and magnetically coupled to the upper shield.

45 Claims, 4 Drawing Sheets

HIGH MOMENT WRAP SHIELDS FOR MAGNETIC READ HEAD TO IMPROVE MICRO-MAGNETIC READ WIDTH

RELATED PATENT APPLICATIONS

This application is related to Ser. No. 13/785,227, Filing Date Mar. 5, 2013; Ser. No. 13/785,255, Filing Date Mar. 5, 2013 and Ser. No. 13/863,269, Filing Date Apr. 18, 2013, all assigned to the same assignee and all fully incorporated herein by reference.

BACKGROUND

1. Technical Field

This disclosure relates generally to thin-film magnetoresistive (MR) read sensors (i.e. read heads) and particularly to the enhancement of micro-magnetic read width of such sensors by the use of different shield materials and configurations.

2. Description

The demand for data storage capacity in today's information technology has driven the increase of recording density in magnetic storage. One of the components in magnetic storage that determines the recording density is the read head sensor, which is based on a spin valve magnetoresistance (SVMR) configuration. As the recording density increases to the level of Gb/in$^2$, the size of the recording bit in the magnetic storage medium shrinks into the nanometer range. The size of the read head sensor, therefore, needs to be of that same dimensional order in order to read the bit signal accurately. Typically the cross-sectional area of the read sensor is smaller than 0.1×0.1 microns at the air bearing surface (ABS) of the read/write head for recorded media areal density of 100 Gb/in$^2$ and above.

Current technology utilizes the tunneling magnetoresistive (TMR) effect in the SVMR sensor. Typically, the sensor has a bottom spin valve configuration. This sensor structure includes two ferromagnetic layers, a top and a bottom, separated by an ultra-thin dielectric tunneling layer. The top ferromagnetic layer is a free layer (FL) whose magnetic moment is free to respond to the changing fields produced by the recorded media, whereas the bottom ferromagnetic layer is a reference layer (denoted AP1, for "first antiparallel layer") whose magnetic moment is fixed in space. The dielectric tunneling layer is usually made of MgO or AlOx.

The layer AP1 is pinned by yet another ferromagnetic layer (AP2, for "second antiparallel layer") through a synthetic anti-ferromagnetic (SAF) effect which creates antiparallel magnetic moments in AP1 and AP2. The magnetic moment of the AP2 layer is pinned in spatial direction by an anti-ferromagnetic layer at its bottom surface. When an external magnetic field is applied to the sensor by passing it over a recording medium at its ABS, the FL magnetization will rotate corresponding to the direction of the magnetic field it experiences. Depending upon the memory state ("0" or "1") of the magnetic medium closest to the FL, which translates into the direction of its magnetic field, the magnetization (magnetic moment) of the FL will rotate to a direction either parallel or anti-parallel to that of the AP1. When an electric current passes through the sensor in order to read the FL state of magnetization, the resistance R will change in accord with the joint magnetization states of FL and An R is low when the magnetization of the FL is parallel to the AP1 and high when antiparallel. Thus the read head sensor will register a bit as a "0" or "1".

The typical design of a read head sensor is based on an abutting junction configuration in which the sensor is surrounded by shields (bottom shield S1, top shield S2 and side shields) to isolate it from unwanted external fields. The sensor is also etched at the back edge to produce an island shape with dimensions in nm×nm range. At this size range, the FL of the sensor will encounter significant demagnetization interference from outside. Therefore, a longitudinal biasing field from side shields is necessary to anchor the magnetization of the FL and keep it from fluctuation. Conventionally, the side shields consist of a hard bias layer (a layer of "hard" magnetic material) formed adjacent to each side of the free layer of the sensor at the ABS. As the critical dimensions of the sensor element become smaller, the FL becomes more volatile and more difficult to bias. This biasing scheme using a hard bias layer has become problematic due to randomly distributed hard magnetic grains within the hard bias layer. To mitigate the problem, we have proposed in related applications Ser. Nos. 13/785,227 and 13/865,269 (which are fully incorporated herein by reference) a different scheme to use soft magnetic layers (permalloy, supermalloy, MU metal, etc) to form the side shields.

Figure 1:
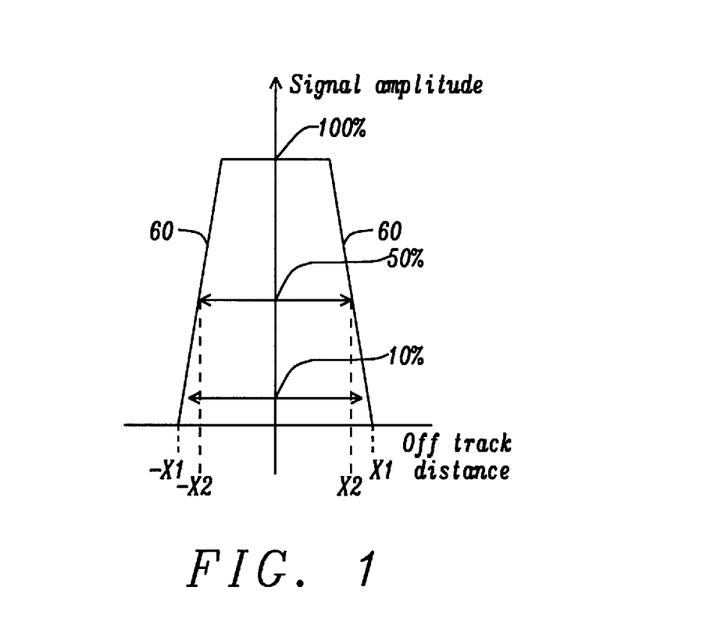
FIG. 1 is a schematic graphical profile showing the cross-track read-back signal amplitude of a prior art read head vs. the distance from a track center.

Referring to FIG. 1, there is shown a schematic graphical illustration of a read-back cross track profile (denoted the "micro read width" or μMRW) which is obtained by scanning the read head across the width of a given data track and plotting the read-back amplitude vs. the off-track distance (distance from track center). The 100% amplitude is the relative strength of the read-back signal when the head is positioned perfectly at the track center. μMRW-10% (the x-axis distance −x1 and x1) and μMRW-50% (the x-axis distance −x2 and x2) are the 10% and 50% micro magnetic read widths that are defined by the width of the cross track profile in FIG. 1 at relative amplitudes corresponding to 10% and 50% of the track center amplitude, respectively. A higher cross track resolution requires a small μMRW and better μMRW sharpness which means the ratio of μMRW-10% and μMRW-50% should be as close to 1 as possible.

In this disclosure, we propose a shield scheme to improve the μMRW sharpness by using high magnetic moment wrap shields on the side and top shields.

The prior arts disclose various attempts at resolving sensor performance problems by the use of various shield structures and materials. Examples are: Lin, (U.S. Pat. No. 7,599,153); Lin, (U.S. Pat. No. 7,606,009) and Nishida et al. (U.S. Pat. No. 7,450,349). However, none of these attempts have addressed the problem in the same manner and with the same effect as the method to be summarized below and then described in further detail herein.

SUMMARY

It is a first object of the present disclosure to provide a shielded MR read sensor in which the side shield is coupled to the top shield for improved stability.

It is a second object of the present disclosure to provide such a shielded MR read sensor in which a side shield of soft magnetic material replaces a hard bias layer so that a smaller domain size is obtained which, thereby, improves overall sensor stability.

It is a third object of the present disclosure to provide a side shield formed of a soft magnetic material that combines low coercivity with high magnetic moment to produce the desired sensor stability.

It is a fourth object of the present disclosure to provide the stability enhancing shields described above while also wrapping layers of high magnetic moment about the shields in order to obtain better μMRW (micro magnetic red width) sharpness.

It is a fifth object of the present disclosure to sharpen said μMRW by reducing the gap between the sensor free layer and the biasing layer.

It is a sixth object of the present disclosure to prevent any pinning by a metal seed layer onto the high magnetic moment layer coupled with soft magnetic shields.

It is a seventh object of the present disclosure to provide a method by which the anisotropy of the high magnetic moment layer's magnetization is aligned with that of the soft magnetic shield material of the side shields through an annealing process in the presence of a longitudinal magnetic field, for efficient biasing of the free layer.

It is an eighth object of the present disclosure to provide a side shield formed of a magnetic material alloy composition that will exhibit high overall magnetic moment and low coercivity, while also enhancing μMRW of the sensor.

Conventionally, the longitudinal biasing scheme exploits the properties of a hard bias by using hard magnetic materials (hard magnets=high coercivity) such as CoPt, FePt, and the like, formed adjacent to both sides of the sensor at the ABS. In our previous referenced applications, fully incorporated herein by reference, (Ser. Nos. 13/785,227, 13,785,255, 13/863,269), we first proposed (but did not fully exploit) a different scheme that exploits the properties of a soft magnetic material (soft magnet=low coercivity) for the longitudinal biasing layers, in order to improve the sensor stability. This soft material biasing layer could be a single soft magnetic layer such NiFe and NiFeMe (where Me=Mo, Cr, Cu, etc) or laminated layers of magnetic layers and non-magnetic layers to form a stronger AFM (anti-ferromagnetic) coupling layer to the top shield.

In this disclosure, we propose yet another design for the shields, differing from the previous approaches, in that: (1) the soft magnetic layers are formed without the use of a seed layer, and (2) the sensor is wrapped with a thin layer of high magnetic moment Fe ("high-moment" material). Moreover, the disclosed structure has the added capability of being magnetically aligned in the longitudinal direction by annealing. Other high moment materials that have the same property as Fe may also be used. These materials may include FeNi where the Fe content is above 30%. The thickness of the high moment layer is between approximately 10 A and 50 A. Preferably, the high moment wrap layer is formed in the closest proximity with the FL of the sensor and beneath and in contact the soft magnet side shields.

Preferably, the high moment Fe layer is integrated into the longitudinal biasing scheme as described in related application Ser. No. 13/785,227. In a preferred embodiment, the sensor has a bottom spin valve configuration with an intrinsic AFM layer, SAF (Synthetic Antiferromagnetic) reference layer, non-magnetic spacer layer, ferromagnetic free layer, and capping layer sequentially formed on a bottom shield, so that the bottom surface of the AFM layer contacts the bottom shield and the top surface of the capping layer interfaces with the top shield.

The high moment layer (or layers) are formed directly on an insulation layer such as a layer of AlOx, MgO, SiNx, SiO2, etc., that isolates the sensor side walls from the side shields without any intervening metal seed layer. The advantages of forming the high moment Fe layer directly on the insulation layer without the seed layer typical of the prior art are: (1) to reduce the width of the gap between the side of the FL and the biasing layer so that the μMRW sharpness is improved; (2) to prevent the seed layer from pinning the magnetic flux of the free layer to the soft magnet side shields; and (3) to be able to align the anisotropy or the magnetization of the high moment layer and the soft magnetic layer in the side shields with annealing under magnetic field along the longitudinal direction for efficient biasing for the FL. These properties will all improve the sensor stability.

Layers of a magnetically soft material such as permalloy, supermalloy, or MU-metal is sequentially formed on the high moment layer. The typical thickness of this layer is approximately 50 A-300 A. This high moment and soft (low coercivity) magnetic layer composite will exhibit high permeability or low coercivity yet it contains a high flux density due to the high moment layer in close proximity to the sensor FL. These properties are essential for good device performance with good stability and better μMRW sharpness.

The present disclosure also includes a method of forming a sensor that is stabilized with side shields having an AFM coupling configuration, and forming the wrap shield structure comprised of the high moment layer Fe or other materials with similar properties.

DETAILED DESCRIPTION

The conventional design of a read head typically uses a hard bias layer in the longitudinal biasing. In related applications Ser. Nos. 13/785,227, 13/785,255, 13/863,269; all fully incorporated herein by reference, it was proposed to use a soft magnetic layer for longitudinal biasing, with that layer formed as a composite of multiple soft magnetic layers coupled to the top shield to improve the stability of the read sensor.

In the present disclosure, in addition to proposals previously implemented in above designated applications Ser. Nos. 13/785,227, 13/785,255, 13/863,269, we further propose to wrap the sensor about its sides and bottom periphery with a thin layer of high moment Fe or Fe-containing material and, in addition, to eliminate all seed layers from the soft magnetic biasing layers.

As will be shown below, the high moment layer is formed directly on an insulation layer that isolates the sensor side walls from the side shields. Unlike the prior art, no metal seed layer is needed for the high moment layer. Preferably, the high moment layer should be as close to the FL (free layer) as possible on both the side and the top of the sensor, a condition which would not have been possible if using a seed layer. The insulation layer in between the FL side walls and the high moment layer should be as thin as possible yet thick enough for effective electrical isolation. This is to increase the magnetic flux density around the FL so that the µMRW (micromagnetic read width) sharpness, as shown in FIG. 1, is improved.

Figure 2:
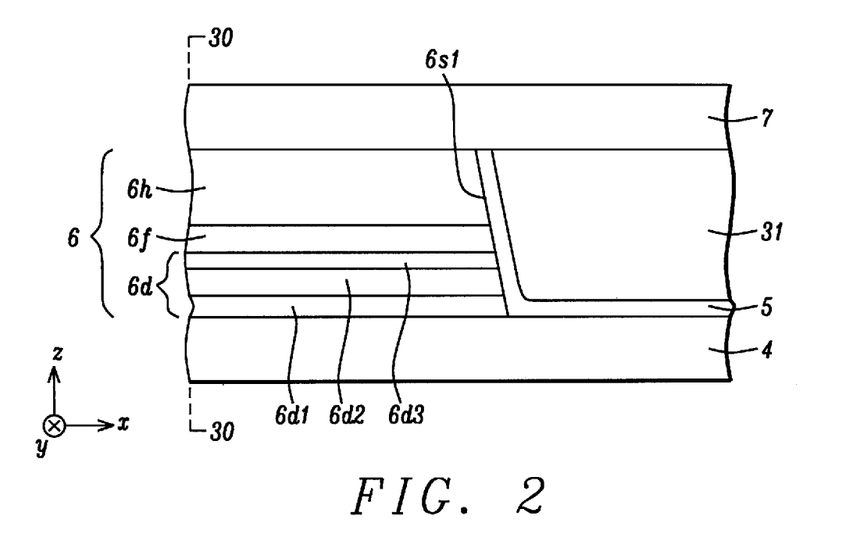
FIG. 2 is a schematic cross-sectional view (in a plane perpendicular to the ABS plane) of a prior art bottom spin-valve read head configuration showing a typical top and bottom shield configuration.

Referring to prior art FIG. 2, there is shown a cross-sectional view (in a y-z plane, perpendicular to the x-z ABS plane) of a bottom spin valve read head shielded only at its top and bottom. The stack includes composite layer 6d, which is a reference layer, layer 6f, which is a free layer and layer 6h, which is a capping layer. The bottom shield 4 and top shield 7 both extend in a y-axis direction, away from the ABS plane, beyond the sloped back side edge 6s1 of the sensor. In the x-direction, the shields are above and below the patterned sensor stack in the ABS plane. It is noted that in this cross-sectional view, side shields are not seen since they would be in front of and behind the plane of the cross-section. It is further noted that the sensor may be of a tunneling magnetoresistive type (TMR), in which case the free layer is separated from the reference layer by a dielectric layer, or it may be a giant magnetoresistive type sensor (GMR), in which case the free layer is separated from the reference layer by a non-magnetic, but electrically conducting, spacer layer.

According to the configuration shown, an insulation layer 31 made of AlOx, MgO, or SiO2, for example, is formed on insulation layer 5 that lies along (conformally abutting) the back side edge 6s1. Also shown in cross-sectional FIG. 2 are the portions of the insulation layers 5, 31 that are formed on a portion of the top surface of bottom shield 4. The insulation layers 5, 31, however, could also be formed on any of the layers of the sensor below the free layer 6f. In an alternative embodiment, layers 5, 31 may be combined into a single insulation layer 5. Note that other layers 6d, 6h within the sensor are formed below and above the free layer 6f, respectively, and may each contain one or more layers.

In a bottom spin valve configuration as is shown in FIG. 2, layer 6h comprises at least a capping layer (not shown), and composite layer 6d typically includes a bottom seed layer 6d1, a reference layer 6d2 with a fixed magnetization direction (often called a pinned layer), and a non-magnetic spacer 6d3 that is between the reference layer and free layer 6f (if the sensor is a GMR sensor). In another aspect, bottom layer 6d1 may be a composite layer including a lower seed layer and an upper antiferromagnetic (AFM) layer that contacts the reference layer. The AFM layer may be comprised of IrMn, MnPt, or the like and is used to pin the magnetization direction in the reference layer 6d2 (often called a pinning layer).

Figure 3A:
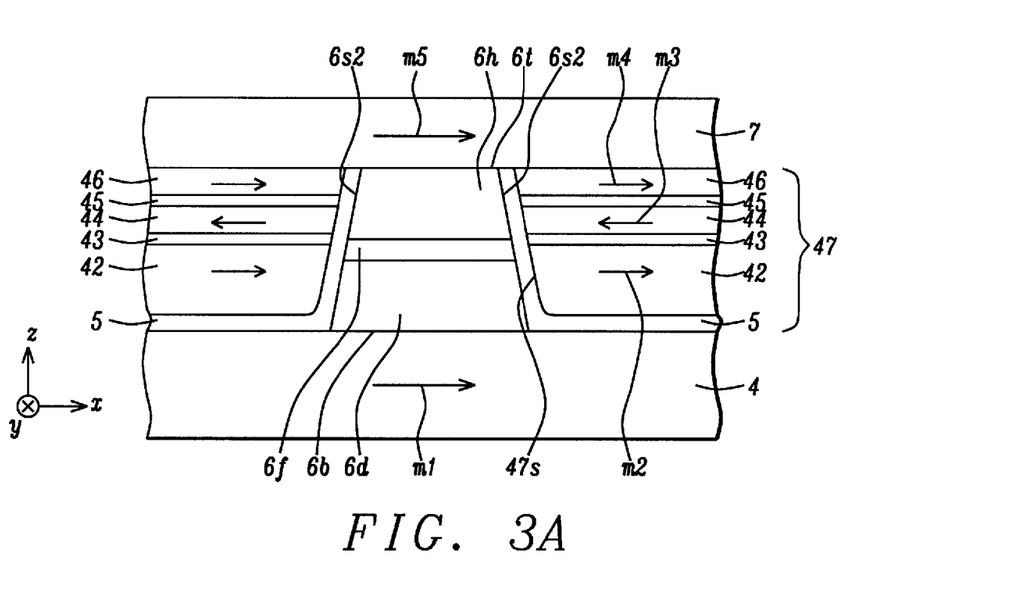
FIG. 3A is a schematic representation, in an ABS plane, of a first embodiment of the present shielded read head including only a side shield structure formed with no seed layers.
Figure 3B:
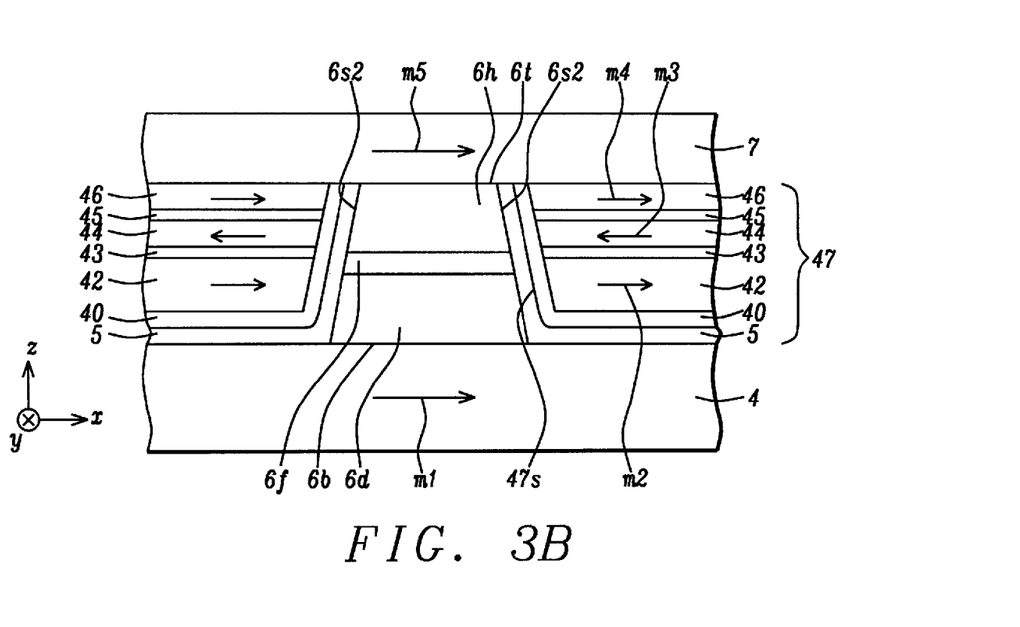
FIG. 3B is a schematic representation of a prior-art shielded read head showing the presence of a seed layer.

Referring next to FIG. 3A, there is shown a schematic illustration of a stabilized side shield sensor design illustrating a first embodiment of the present disclosure. A schematic design, shown in FIG. 3B, shows a prior-art structure, presented here for contrast only, that was previously disclosed in related applications Ser. Nos. 13/785,227 and 13/785,255. The structure in FIG. 3B would not meet the objects of the present disclosure because, as shown in FIG. 3B, it includes a seed layer, shown as layer 40, which is interposed between (and contiguous with) an insulation layer 5 and a shield layers 42, 43, 44, 45 and 46, collectively denoted 47.

The present disclosed first embodiment in FIG. 3A is found to provide advantages of the shield structure in the inset, with additional advantages that include (but are not limited to) a significantly improved cross-track read profile or micro-magnetic read width, µMRW. This improvement is obtained by the elimination of that seed layer (40 in FIG. 3B) from the side shield structure, which narrows the width of the shield without degrading its magnetic properties (as discussed above). This narrowed shield width is reflected in the improvement in µMRW. In addition to the physical narrowing of the structure because the seed layer 40 is absent, there are also advantages that are a result of the absence of the alloys typically used to form the seed layer, such as bilayers of Ta/Ru. The presence of these alloys adjacent to the edges of the free layer can adversely affect the magnetic properties of the sensor.

The first embodiment shielded sensor of FIG. 3A is shown in a cross-sectional view from an ABS perspective. The multiply-layered side shield structure, collectively denoted 47, is formed on both sides of the patterned sensor (shown here as three layers 6d, 6f and 6h, in a trapezoidally patterned shape) between the top, 7, and bottom, 4, shields. The side shields 47 provide longitudinal biasing to the free layer 6f in adjacent sensor stack 6d, 6f and 6h.

The bottom shield 4 has a magnetization (arrow) m1 aligned in a cross-track (x-axis) direction, and top shield 7 has a magnetization (arrow) m5 aligned in the same direction as m1. In this exemplary configuration, free layer 6f has a magnetization (not shown) that would be either parallel or anti-parallel to m1 depending on the magnetic state ("0" or "1") of the sensor. The m1 direction in the shield is typically set by a first anneal step that is performed before the layers in the sensor are deposited.

An aspect of the sensor is that the side shield structure 47 has sidewalls 47s formed adjacent to sides 6s2 of the sensor itself and the sensor free layer 6f. The sidewalls are separated from the sensor sides by the insulation layer 5. The side shield structure extends rearward from the ABS, in the positive y-direction, for a distance of between 30 nm to 2 microns toward a back end of the read head.

The two side edges 6s2 of the patterned sensor connect with a single backside edge 6s1 (not visible in this figure, but shown in FIG. 2) at a certain distance behind the ABS and thereby form a continuous sidewall around the side and rear periphery of the sensor. This is shown clearly in an overhead view of the sensor periphery illustrated in FIG. 5 below and discussed there.

As is seen in the schematic illustration of the shielded sensor of FIG. 3A, an insulation layer 5 is formed on a top surface of bottom shield 4 except over the portion of the bottom shield surface, denoted 6b, on which sensor layer 6d is formed. Thus, the bottom of layer 6d directly contacts the upper surface of the bottom shield, 4, along the surface portion 6b. The insulation layer 5 then extends upward along sidewalls 6s2 to separate the sensor from the side shields 47. The distinction of the present disclosure from either of our previous disclosures Ser. Nos. 13/785,227 and 13/785,255 as shown in FIG. 3B, is that those previous disclosures exploit a seed layer 40 abutting the side shield structure 47, interposed between structure 47 and insulation layer 5. In FIG. 3A, the seed layer is omitted and its absence is found to improve the performance of the shielded sensor for several reasons discussed below.

In order to further improve the µMRW sharpness as illustrated in FIG. 1, the present disclosure eliminates this seed layer so that the longitudinal biasing layer is in the closet possible proximity with the free layer. The elimination of the seed layer, which would typically be a bi-layer of Ta/Ru of about 20 A total thickness, has several important advantages for the performance of the sensor, particularly when the side shields also include a high magnetic moment layer as will be discussed in a second embodiment shown in FIG. 4. First, in both the embodiments of FIG. 3A and FIG. 4, the absence of the seed layer reduces the gap between the free layer of the sensor and the biasing layers within the shield so that the micro-magnetic read width is improved by this gap reduction. Second, pinning of the high moment layer flux by the seed layer (see particularly the second embodiment of FIG. 4) and by the soft magnetic shields is therefore prevented. Such pinning is undesirable because it is uncontrollable. It is much preferred that the magnetization of the high moment layer and of the shields as a whole be set by the subsequent annealing of the completed sensor under magnetic field conditions which are controllable. It becomes much easier to align the anisotropy or magnetization of the high moment layer and the soft magnetic layers in the side shields by annealing in a longitudinal magnetic field.

Above the insulation layer 5, which is a layer of AlOx, MgO, SiNx, SiO$_2$ or the like, typically formed to a thickness between 20 A and 50 A, there is sequentially formed a first magnetic layer 42, a first antiferromagnetic (AFM) coupling layer 43, s second magnetic layer 44, a second AFM coupling layer 45, and a third magnetic layer 46. These layers abut the insulation layer against the sides of the sensor. As a result, the magnetization (arrow m2) of the first magnetic layer 42 is aligned anti-parallel to magnetization (arrow m3) of the second magnetic layer 44 while magnetization (arrow m4) of the third magnetic layer 46 is also aligned anti-parallel to m3. The first magnetic layer preferably has a greater thickness than the second and third magnetic layers and thereby provides a majority of the longitudinal biasing to free layer 6f. Third magnetic layer 46 contacts a bottom surface of the top shield 7 which induces m4 to be aligned in the same direction as (arrow m5) the magnetization of top shield 7. Consequently, the top shield plays an important role in stabilizing the magnetization m2 and m4, respectively, which are parallel to m5.

AFM coupling between first magnetic layer 42 and second magnetic layer 44, and between second magnetic layer 44 and third magnetic layer 46 also contributes to overall stabilization of the magnetic moments within the side shields 47. Enhanced stabilization of the side shields leads to high output sharpness and improved magnetic read width. Moreover, side shields 47 prevent stray magnetic fields produced by a magnetic medium from inadvertently switching the magnetization direction of the free layer.

Preferably, the first, second, and third magnetic layers are comprised of one or both of the alloys CoFe and NiFe wherein the Ni content is between 70 and 90 atomic % to yield a soft magnetic layer. The alloys: NiFeMe (Me=Mo, Cr or Cu) can replace the NiFe in one of more the magnetic layers. As an example, the first magnetic layer 42 may be a NiFe/CoFe composite wherein the lower NiFe has a thickness from 50 to 300 A, while the CoFe layer preferably has a thickness between 5 to 20 A. Preferably, the second magnetic layer 44 is made of CoFe or a CoFe/NiFe/CoFe composite that has a thickness from 5 to 50 A, respectively. The third magnetic layer 46 may have a CoFe/NiFe configuration wherein the lower CoFe layer contacts the second AFM coupling layer 45 and has a thickness between 5 to 20 A, and the upper NiFe layer preferably has a thickness from 50 to 200 A. According to this embodiment, the NiFe layer in the first magnetic layer provides a majority of the longitudinal biasing to the free layer. The biasing strength can be tuned by adjusting the thickness of the NiFe layer.

In a further aspect, the AFM coupling layers 43, 45 are made of Ru and have a thickness of 7 to 9 A to promote maximum AFM coupling (i.e., maintaining antiparallel magnetizations) between adjacent magnetic layers in the side shields.

Figure 4:
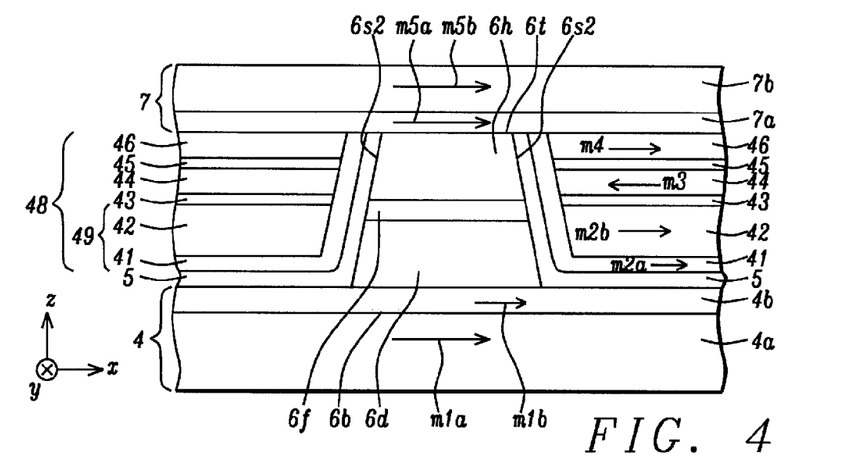
FIG. 4 is a schematic representation, in an ABS plane, of a second embodiment of a shielded read head of the present disclosure.

Referring now to FIG. 4, a further embodiment of the present disclosure is schematically illustrated that retains all of the elements comprising the first embodiment structure in FIG. 3A, and, in addition, includes a high magnetic moment layer 41 (also denoted, for simplicity, a "high moment" layer) that is formed covering a portion of the peripheral surfaces of the side shields. The position of the high moment layer over the side shields effectively interposes it between the side shields 48 and the layer of insulation 5. In this position, the high moment layer is able to concentrate magnetic flux from the side shields to the magnetic layers of the sensor. We will call this high moment layer 41 the "first" high moment layer where we wish to distinguish it from other high moment layers.

Additional high moment layers (additional to the first high moment layer 41) are formed as part of the upper and lower shields. Specifically, as a lower layer 7a of the top shield 7 and as an upper layer 4b of the bottom shield 4. All of these high moment layers serve to stabilize the sensor and the first such layer 41 surrounding the bottom and sides of the side shield 48, also concentrates flux onto the sides of the sensor stack further improving the micro-magnetic read width sharpness.

The first high moment layer 41 is formed directly on the insulation layer 5 and is thereby contiguous with and conformal to layer 5. The high moment layer continuously follows the shape of layer 5 but does not extend to cover the portion of layer 5 that covers the backside of the sensor.

Insulation layer 5 is formed above a top layer 4b of the bottom shield 4 and is contiguous with and conformal to patterned sensor sides 6s2. Layers 41 and 42 form a composite magnetic layer 49 that provides a majority of the longitudinal biasing to the free layer 6f in the sensor element. Note that magnetization vectors m2a and m2b in the high moment layer 41 and bottom shield layer 42 respectively are parallel to each other. The high moment layer 41 has a thickness between approximately 5 A and 50 A, but preferably from approximately 10 A to 30 A. In one embodiment, the high moment layer 41 is Fe. In another embodiment, the high moment layer 41 may be formed of other materials that have similar properties to Fe, such as FeNi alloy in which the Fe content is greater than 30 atomic %.

Layers 42-46 in each side shield 48 are sequentially formed on the first high moment layer 41. Magnetic layers 42, 44, 46 are made of one or both CoFe and NiFe as described previously. Note also that layers 44, 45 and 46 may form a synthetic antiferromagnetic structure where magnetizations m3 and m4 are antiparallel.

The top shield 7 is a composite structure having a second high moment layer 7a that contacts a top surface 6t of the sensor element and forms an interface with side shields 48 along a top surface of the second magnetic layer 46. The top shield also comprises an upper magnetic layer 7b which may have the same material composition as the bottom layer 4b in the bottom shield.

As yet another embodiment of this disclosure, layers 7a and 4b are both also layers of high magnetic moment material, so that the sensor stack is completely encased in such high magnetic moment material, along its sides and bottom, by layer 41, and along its top by layer 7a and its bottom by layer 4b. The layers 7a and 4b act in an advantageous manner in improving μMRW due to their close proximity to the sensor stack and their strengthening of the magnetic interactions that bias and stabilize the sensor.

Figure 5:
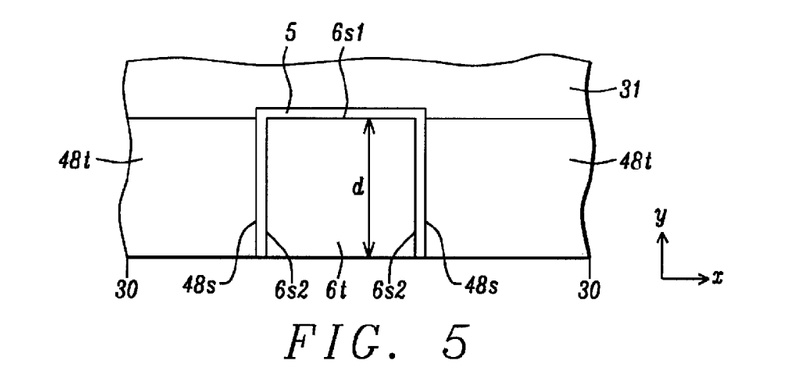
FIG. 5 is a top-down view of the read head of FIG. 4, with the top shield removed to show additional structure of the side shields.

Referring now to FIG. 5, there is shown an overhead view of the embodiment of FIG. 4, where top shield 7 has been removed to show a top surface 48t of the side shield structure 48. Note, the entire shield is labeled 48 in FIG. 4, but its upper layer is 46, so 48t could equally well be labeled 46t in FIG. 5.

FIG. 5 also shows a top surface, labeled 6t, of the patterned sensor (which would be the top surface of layer 6h in FIG. 4). Also shown in FIG. 5 are the two parallel side edges of the sensor, 6s2 that extend rearward in the +y direction and the backside edge of the sensor, 6s1. The side shield sidewalls 48s, which form the periphery of the top edges of layers 5 and 41, extend parallel to sides 6s2 of the patterned sensor, towards a backside 6s1 of the sensor wherein the sensor backside is located a distance d of 30 nm to 2 microns in a positive y-axis direction from the ABS. Note that the space between 6s2 and 48s will contain the edges of the contiguous pair 5 and 41, the layer of insulation and the high moment layer. However, while layer 5 extends around the backside, 6s1, of the sensor, layer 41 abuts only the side 6s2.

In addition, the present disclosure also anticipates an embodiment wherein side shields 48 extend rearward (+y direction) for a greater distance than d from the ABS. Preferably, the sidewalls 48s extend at least a distance d to provide a maximum biasing effect to the free layer in the sensor.

The present disclosure also discloses a method of forming a sensor with a wrap-around shield configuration that is stabilized by AFM coupling between the magnetic layers in the side shields, and includes a high moment layer in each shield to enable a better μMRW for improved read head performance. This fabrication method will be described below.

Figure 6:
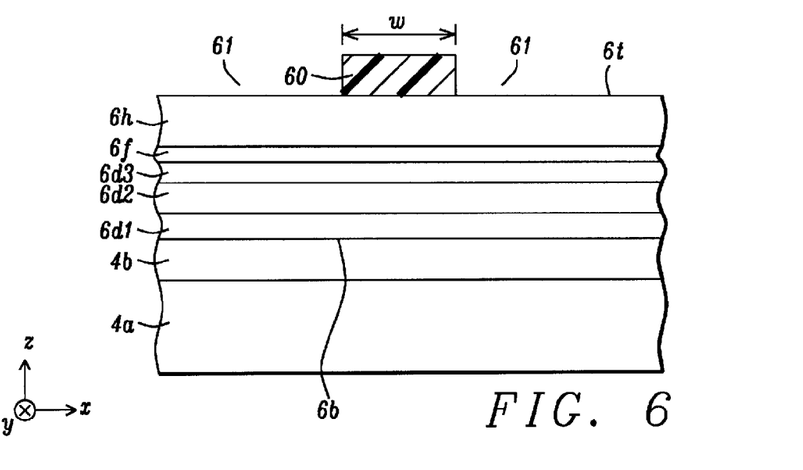
FIG. 6 is a schematic illustration of the first step in a fabrication process of the present read head.

In FIG. 6, a first step in a fabrication process is illustrated wherein bottom shield layer 4 (i.e. the bi-layer 4a and 4b) is formed on a substrate (not shown) by a sputtering method of physical vapor deposition (PVD), for example. The bottom shield is annealed by a conventional process to set the magnetization m1a, m1b, shown in FIG. 4, in an x-axis direction. Thereafter, layers 6d1, 6d2, 6d3, 6f, and 6h in the sensor stack are sequentially formed by PVD, with the bottom surface 6b of layer 6d1 contacting a top surface of the bottom shield. Layer 6d3 may be a non-magnetic, but electrically conductive metal such as Cu in a giant magnetoresistvie (GMR) sensor or a non-conducting oxide such as MgO in a tunneling magnetoresistive (TMR) sensor. Free layer 6f may be a single layer or a composite including a plurality of magnetic layers. A composite free layer may have a synthetic antiferromagnetic configuration wherein two ferromagnetic layers are separated by a coupling layer such as Ru and aligned with antiparallel magnetizations. The uppermost layer 6h is a capping layer that may be one or more of Ta and Ru, or other materials used in the art.

During the following step in the fabrication sequence, a photoresist layer is spin coated and patterned on the sensor top surface 6t by a conventional photolithography process to generate a pattern including a photoresist island 60 having a width w, typically between 20 nm-50 mm in the cross-track (x) direction after photoresist trimming. The photoresist pattern typically includes a plurality of islands arranged in rows and columns that, from a top-down view, are each similar to the sensor top surface 6t shown in FIG. 5. There are openings 61 on either side of the photoresist island that expose a substantial portion of top surface 6t. It should be understood that a portion of top surface 6t is also uncovered along a back side (not shown) of layer 60 to completely isolate adjacent islands in the photoresist pattern.

Figure 7:
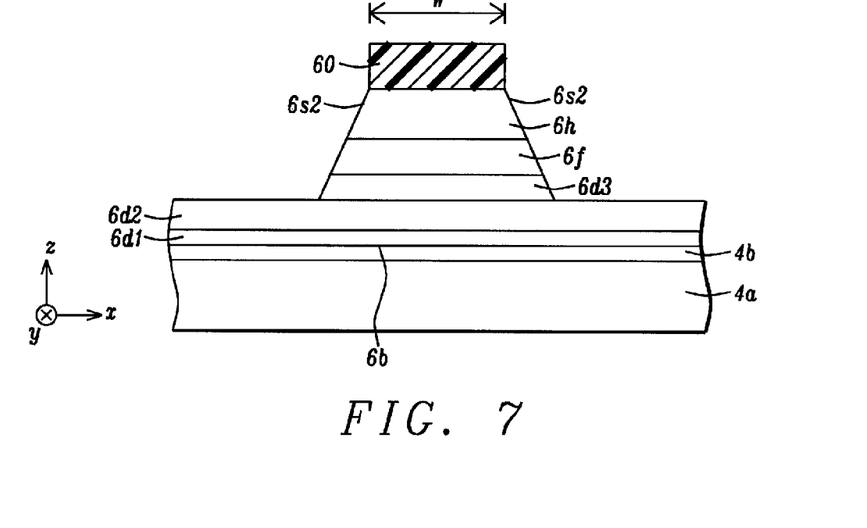
FIG. 7 is a schematic illustration of a subsequent step to that shown in FIG. 6, showing results of an ion-milling process or an ion beam etch (IBE) here being applied in the formation process of the presently disclosed read head.

Referring to schematic FIG. 7, an ion milling process or ion beam etch (IBE) process as disclosed in related patent application Ser. No. 13/803,362 and fully incorporated herein by reference is performed to transfer the shape of the photoresist island 60, in the negative z direction, down through the sensor stack of layers. In particular, the IBE includes a step wherein incident ions have an angle of 0 to 10 degrees with respect to a plane (not shown) that is perpendicular to top surface 6t. The IBE process stops on a top surface 62 of reference layer 6d2.

In an alternative embodiment, the first IBE step is extended downward to produce an over-etch that penetrates beyond 62 and etches into the SAF reference layer 6d2. The over-etch is to insure that the free layer 6f is completely etched away so that no remnants produce shunting problems. The IBE process may include a second step that features an IBE side trim at an angle of 45 to 75 degrees to reduce the free layer width and, incidentally, to shape the sides of the sensor element.

When the width dimension w is substantially less than 100 nm, then sloped sides 6s2 are usually desirable to prevent collapse of the sensor during a subsequent milling step. An IBE process is generally preferred as the etch method to generate sloped sidewalls since the ions can be angled with respect to the z-axis direction. As a result, the cross-track distance between sides 6s2 at the position of the non-magnetic spacer 6d3 is generally greater than the track width w at the top surface of upper layer 6h.

Figure 8:
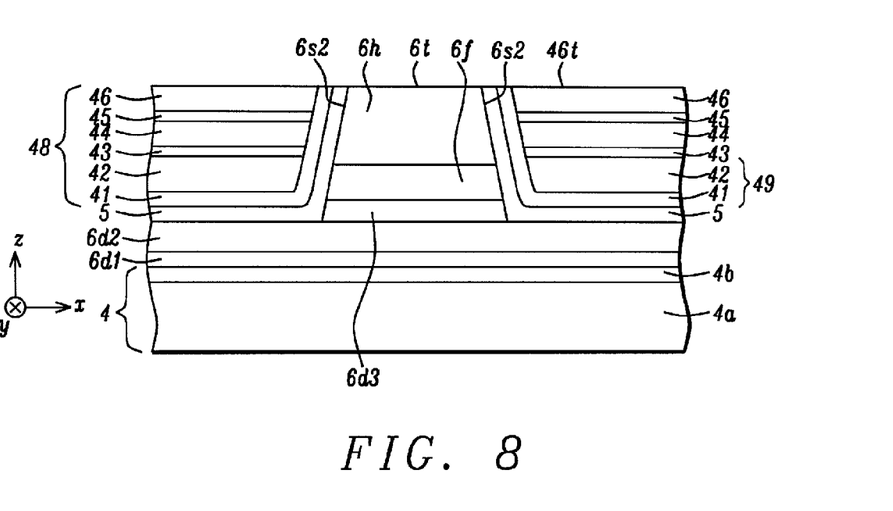
FIG. 8 is a schematic illustration showing results of further steps in the fabrication process of the read head presently disclosed.

In schematic FIG. 8, insulation layer 5 is deposited along the sides 6s2 by ion beam deposition (IBD), PVD (physical vapor deposition), or atomic layer deposition (ALD) to a thickness between approximately 20 A-50 A. Next, the side shields 48 are formed adjacent to sides 6s2 by consecutively depositing the high moment layer 41 over the insulation layer, then forming the first magnetic layer 42, the first AFM layer 43, the second magnetic layer 44, the second AFM layer 45, and the third magnetic layer 46 by IBD or PVD method. When an IBD method is used for depositing the insulation layer 5 and the side shield layers, the deposition angle may be varied to fine tune the sidewall coverage of the side shields. When the IBD angle is close to normal with respect to the plane of the wafer, the insulation layer 5 coverage is the thinnest at sides 6s2. In PVD, the process pressure may be varied to fine tune the sidewall coverage. The photoresist layer 60 is then removed by a standard liftoff process. A chemical mechanical polish (CMP) process may be employed to form a top surface 46t that is essentially coplanar with a top surface 6t of the sensor.

Thereafter, a top shield is formed by IBD or PVD to complete the shield structure illustrated in FIG. 4. A second anneal step may be performed to set the magnetization direction of layers 7a, 7b in top shield 7, and layers 41, 42, 44, 46 in the side shields.

In summary, we have disclosed a wrapped shield structure and its method of fabrication. The structure provides biasing to a free layer in an adjacent sensor stack and improved stabilization. Furthermore, micro magnetic read width performance is enhanced compared with the prior art.

As is understood by a person skilled in the art, the present description is illustrative of the present disclosure rather than limiting of the present disclosure. Revisions and modifications may be made to methods, materials, structures and dimensions employed in forming and providing a read sensor having a wrapped shield structure formed without seed layers for improved micromagnetic read width performance and enhanced magnetic stability, while still forming and providing such a read sensor and its method of formation in accord with the spirit and scope of the present disclosure as defined by the appended claims.

What is claimed is:

1. A shielded read sensor comprising:
a horizontal lower shield formed of magnetic material;
a horizontal upper shield formed of magnetic material;
a horizontally layered, patterned sensor formed centrally between said lower shield and said upper shield, wherein said patterned sensor has an upper surface and a lower surface and a planar ABS surface and a backside surface substantially parallel to said planar ABS surface and separated from said planar ABS surface by a distance d, and wherein said patterned sensor further includes horizontally opposed side surfaces and wherein said lower surface of said patterned sensor contacts an upper surface of said horizontal lower shield and wherein said upper surface of said patterned sensor contacts a lower surface of said upper shield; and
wherein a layer of insulation uniformly, contiguously and conformally covers said opposed side surfaces and said backside surface of said patterned sensor and extends laterally over a portion of said upper surface of said lower shield that is laterally disposed to either side of said patterned sensor stack; and wherein
a symmetrically disposed pair of horizontal side shields abut each side of said patterned sensor; wherein
each of said horizontal side shields includes a multiplicity of horizontal magnetic layers; and wherein
each of said side shields comprises a first magnetic layer that is a lowermost layer, a first antiferromagnetic (AFM) coupling layer formed on said first magnetic layer, a second magnetic layer, a second AFM coupling layer formed on said second magnetic layer, and a third magnetic layer that is an uppermost layer;
wherein said first, second and third magnetic layers are magnetized, wherein said magnetization of said first magnetic layer is aligned anti-parallel to said magnetization of said second magnetic layer while a magnetization of said third magnetic layer is aligned anti-parallel to said magnetization of said second magnetic layer; wherein
said uppermost magnetic layer of each of said pair of side shields has a horizontal upper surface that contacts said lower surface of said horizontal upper shield; and wherein
said lowermost magnetic layer of each of said pair of side shields has a horizontal lower surface that contacts said layer of insulation that extends laterally over a portion of said upper surface of said lower shield; and wherein
each of said pair of side shields has a side surface that includes lateral edges of said horizontal magnetic layers and wherein said lateral edges conformally abut and contact said layer of insulation that uniformly, contiguously and conformally covers said opposed side surfaces of said patterned sensor; whereby
each of said pair of side shields is capable of being magnetically stabilized by a magnetic interaction with said horizontal upper and lower shields and wherein;
no seed layers are utilized in the formation of said side shields; and wherein
said patterned sensor is capable of being longitudinally biased and magnetically stabilized by magnetic interaction with said side shields, said top shield and said bottom shield.

2. The shielded read sensor of claim 1, wherein said patterned sensor is a TMR sensor.

3. The shielded read sensor of claim 1, wherein said patterned sensor is a GMR sensor.

4. The shielded sensor of claim 1 wherein said distance d is between approximately 30 nm to 2 microns.

5. The shielded sensor of claim 1 wherein said first magnetic layer has a greater thickness than either of said second or said third magnetic layers and thereby provides a majority of a longitudinal biasing to a free layer of said sensor.

6. The shielded sensor of claim 1 wherein said third magnetic layer contacts a bottom surface of said top shield, thereby inducing said magnetization of said third magnetic layer to be aligned in a same direction as said magnetization of said top shield, whereby said top shield stabilizes magnetizations of each of said side shields.

7. The shielded sensor of claim 6 wherein said first, second, and third magnetic layers are formed of one or both of the alloys CoFe and NiFe wherein the Ni content is between 70 and 90 atomic % to yield a soft magnetic layer.

8. The shielded sensor of claim 7 wherein the alloy NiFeMe, where Me=Mo, Cr or Cu, replaces the NiFe in one of more the first, second and third magnetic layers.

9. The shielded sensor of claim 8 wherein said first magnetic layer is a NiFe/CoFe composite layer wherein the lower NiFe layer has a thickness between approximately 50 to 300 A, while said CoFe layer has a thickness between approximately 5 to 20 A, wherein said second magnetic layer is formed of CoFe or a CoFe/NiFe/CoFe composite that has a thickness between approximately 5 to 50 A, respectively and wherein said third magnetic layer has a CoFe/NiFe layered configuration wherein said CoFe layer contacts said second AFM coupling layer and has a thickness between 5 to 20 A, and the upper NiFe layer has a thickness between approximately 50 to 200 A.

10. The shielded sensor of claim 9 wherein said AFM coupling layers are formed of Ru and have a thickness of between approximately 7 A to 9 A.

11. The shielded sensor of claim 1 wherein said patterned sensor has a width of between 20 and 50 nm.

12. The shielded sensor of claim 1 wherein said layer of insulation has a thickness of between approximately 20 A and 50 A.

13. A shielded sensor comprising:
a double-layer horizontal lower shield formed of magnetic material;
a double-layer horizontal upper shield formed of magnetic material;
a horizontally layered, patterned sensor formed centrally between said double-layer lower shield and said double-layer upper shield, wherein said patterned sensor has an upper surface and a lower surface and a planar ABS surface and a backside surface substantially parallel to said planar ABS surface and separated from said planar ABS surface by a distance d, and wherein said patterned sensor further includes horizontally opposed side surfaces and wherein said lower surface of said patterned sensor contacts an upper surface of an upper layer of said double-layer horizontal lower shield and wherein said upper surface of said patterned sensor contacts a lower surface of a lower layer of said double-layer upper shield; wherein
a layer of insulation uniformly, contiguously and conformally covers said opposed side surfaces and said backside surface of said patterned sensor and extends laterally over a portion of said upper surface of said upper layer of said double-layer lower shield that is laterally disposed to either side of said patterned sensor stack; and wherein a symmetrically disposed pair of horizontally layered side shields abut each side of said patterned sensor; wherein each of said side shields is formed between said upper and lower shields and abuts said patterned sensor; wherein each of said horizontal side shields includes a multiplicity of horizontal magnetic layers; and wherein a first layer of high magnetic moment material uniformly, continuously, conformally and contiguously covers a portion of peripheral surfaces of said side shields, wherein said covered portion includes a bottom surface of a lowermost magnetic layer of each of said side shields and a side surface of each of said side shields, wherein each of said side surfaces is adjacent to one of said horizontally opposed side surfaces of said patterned sensor and wherein said side surfaces include lateral edges of said horizontal magnetic layers and wherein said layer of high magnetic moment material terminates at said lower surface of said double layer upper shield; wherein an uppermost magnetic layer of each of said pair of side shields has a horizontal upper surface that contacts said lower surface of said lower layer of said double-layer horizontal upper shield; and wherein said portion of said layer of high magnetic moment material that extends laterally over a lowermost portion of each of said side shields contacts said layer of insulation formed on said upper surface of said upper layer of said double-layer lower shield; and wherein each of said pair of side shields has a side surface that includes lateral edges of said horizontal magnetic layers and that conformally abuts and directly contacts said first layer of high moment material that uniformly, contiguously and conformally covers said layer of insulation over said opposed side surfaces of said patterned sensor; whereby each of said pair of side shields is capable of being magnetically stabilized by a magnetic interaction with said horizontal upper and lower shields and wherein;

no seed layers are utilized in the formation of said side shields; whereby said patterned sensor is capable of being longitudinally biased and magnetically stabilized by a magnetic interaction with said side shields, said bottom shields and said top shields.

14. The shielded sensor of claim 13 wherein said lower layer of said double-layer upper shield is a layer of high magnetic moment material and wherein said upper layer of said double-layer lower shield is a layer of high moment magnetic material.

15. The shielded sensor of claim 14 wherein each of said side shields further comprises a first magnetic layer formed on said first high moment layer, a first antiferromagnetic (AFM) coupling layer formed on said first magnetic layer, a second magnetic layer, a second AFM coupling layer formed on said second magnetic layer, and a third magnetic layer.

16. The shielded sensor of claim 15 wherein said first, second and third magnetic layers are magnetized, wherein said magnetization of said first magnetic layer is aligned anti-parallel to said magnetization of said second magnetic layer while a magnetization of said third magnetic layer is aligned anti-parallel to said magnetization of said second magnetic layer.

17. The shielded sensor of claim 16 wherein said first magnetic layer has a greater thickness than either of said second or said third magnetic layers and thereby provides a majority of a longitudinal biasing to a free layer of said sensor.

18. The shielded sensor of claim 17 wherein said third magnetic layer contacts a bottom surface of said bottom layer of said top shield, whereby a magnetic interaction induces said magnetization of said third magnetic layer to be aligned in a same direction as a magnetization of a bottom layer of said top shield, whereby said top shield stabilizes magnetizations of each of said side shields.

19. The shielded sensor of claim 18 wherein said first, second, and third magnetic layers are formed of one or both of the alloys CoFe and NiFe wherein the Ni content is between 70 and 90 atomic % to yield a soft magnetic layer.

20. The shielded sensor of claim 19 wherein the alloy NiFeMe, where Me=Mo, Cr or Cu, replaces the NiFe in one of more the first, second and third magnetic layers.

21. The shielded sensor of claim 19 wherein said first magnetic layer is a NiFe/CoFe composite layer wherein the lower NiFe layer has a thickness between approximately 50 to 300 A, while said CoFe layer has a thickness between approximately 5 to 20 A, wherein said second magnetic layer is formed of CoFe or a CoFe/NiFe/CoFe composite that has a thickness between approximately 5 to 50 A, respectively and wherein said third magnetic layer has a CoFe/NiFe layered configuration wherein said CoFe layer contacts said second AFM coupling layer and has a thickness between 5 to 20 A, and the upper NiFe layer has a thickness between approximately 50 to 200 A.

22. The shielded sensor of claim 18 wherein a bottom surface of said first magnetic layer is separated from a top surface of said top layer of said bottom shield by said high moment layer and said layer of insulation and whereby a magnetization of said top layer of said bottom shield is induced in the same direction as said magnetization of said first magnetic layer.

23. The shielded sensor of claim 22 wherein said AFM coupling layers are formed of Ru and have a thickness of between approximately 7 A to 9 A.

24. The shielded read sensor of claim 13, wherein said patterned sensor is a TMR sensor.

25. The shielded read sensor of claim 13, wherein said patterned sensor is a GMR sensor.

26. The shielded sensor of claim 13 wherein said first high moment layer has a thickness between approximately 5 A and 50 A.

27. The shielded sensor of claim 26 wherein said first high moment layer has a thickness between approximately 10 A to 30 A.

28. The shielded sensor of claim 13 wherein said first high moment layer is formed of Fe.

29. The shielded sensor of claim 13 wherein said first high moment layer is formed of a FeNi alloy in which the Fe content is greater than 30 atomic %, thereby giving said layer similar magnetic properties to a layer of Fe.

30. The shielded sensor of claim 13 wherein said distance d is between approximately 30 nm to 2 microns.

31. The shielded sensor of claim 13 wherein said patterned sensor has a width of between 20 and 50 nm.

32. The shielded sensor of claim 13 wherein said layer of insulation has a thickness of between approximately 20 A and 50 A.

33. A method of making a shielded sensor, comprising:
providing a bi-layer horizontal bottom shield, having a lower layer b and an upper layer a;
annealing said bottom shield to set a magnetization m1a, m1b in a longitudinal direction in said layers a and b respectively;

forming a sensor stack by depositing, respectively and sequentially, sensor-stack layers denoted layers 6d1, 6d2, 6d3, 6f, and 6h on a top surface of layer b of said bottom shield; wherein layer 6d3 is either a non-magnetic conducting layer or a dielectric layer depending upon whether the sensor stack defines a GMR (giant magnetoresistive) sensor or a TMR (tunneling magnetoresistive) sensor; wherein layer 6f is a magnetically free layer that may be a single layer or a composite plurality of magnetic layers; wherein uppermost layer 6h is a capping layer that may be one or more of Ta and Ru; then patterning said sensor stack to produce horizontally opposed side surfaces separated by a track width w, an ABS front surface and a backside surface separated by a depth d, and wherein an exposed upper surface of said upper layer of said bottom shield extends horizontally to either side of said patterned sensor stack; then forming a layer of insulating material conformally over said exposed upper surface of said upper layer of said horizontal bottom shield wherein said layer of insulating material also extends over said horizontally opposed side surfaces of said patterned sensor stack and said backside surface of said patterned sensor stack: then forming side shields conformal and contiguous with said layer of insulation, wherein said side shields abut said horizontally opposed side surfaces, wherein said side shields include a wrap-around high moment layer conformal to and contiguous with said layer of insulation along a portion of said layer of insulation covering said horizontally opposed side surfaces and wherein said side shields further include horizontally layered soft magnetic layers, antiferromagnetically coupled pairwise, abutting said horizontally opposed side surfaces and wherein said soft magnetic layers have an upper surface that is substantially co-planar with an upper surface of said patterned sensor stack.

34. The method of claim 33 further comprising:
planarizing said substantially co-planar upper surface that includes an upper surface of said patterned sensor stack and said wrap-around side shields; then
forming a bi-layered upper shield over said upper co-planar surface; wherein
said bi-layered upper shield includes a lower layer, contacting said planarized layer, wherein said lower layer is formed of high moment material; then
magnetizing said bi-layered upper shield and said side shields, whereby said upper surface of said side shields are magnetically coupled to said lower layer of said upper shield by either direct magnetic coupling or by antiferromagnetic exchange coupling, whereby a stabilized horizontal biasing configuration is achieved.

35. The method of claim 34 wherein the formation of said side shields comprises:
forming a layer of high magnetic moment material directly and conformally over an upper surface of said layer of insulation, said upper surface excluding the upper surface of that portion of said insulation layer covering said backside surface of said sensor; whereby
said layer of high magnetic moment material is thereby separated from said horizontally opposing sides of said patterned sensor stack and said upper surface of said layer a of said bi-layer lower shield only by said layer of insulation, there being no seed layers interposed thereat; then forming a first magnetic layer on said first high moment layer, said first magnetic layer being parallel to a first antiferromagnetic (AFM) coupling layer formed on said first magnetic layer, a second magnetic layer, a second AFM coupling layer formed on said second magnetic layer, and a third magnetic layer.

36. The method of claim 35 wherein, by an annealing and magnetization of said shielded sensor, said first magnetic layer is aligned anti-parallel to a magnetization of said second magnetic layer while a magnetization of said third magnetic layer is aligned anti-parallel to said magnetization of said second magnetic layer.

37. The method of claim 35 wherein said first, second, and third magnetic layers are formed of one or both of the alloys CoFe and NiFe wherein the Ni content is between 70 and 90 atomic % to yield a soft magnetic layer.

38. The method of claim 37 wherein the alloy NiFeMe, where Me=Mo, Cr or Cu, replaces the NiFe in one of more the first, second and third magnetic layers.

39. The method of claim 35 wherein said first magnetic layer is a NiFe/CoFe composite layer wherein the lower NiFe layer has a thickness between approximately 50 to 300 A, while said CoFe layer has a thickness between approximately 5 to 20 A, wherein said second magnetic layer is formed of CoFe or a CoFe/NiFe/CoFe composite that has a thickness between approximately 5 to 50 A, respectively and wherein said third magnetic layer has a CoFe/NiFe layered configuration wherein said CoFe layer contacts said second AFM coupling layer and has a thickness between 5 to 20 A, and the upper NiFe layer has a thickness between approximately 50 to 200 A.

40. The method of claim 33 wherein said patterning of said sensor stack comprises:
forming a layer of photoresistive material on a top surface of said sequence of horizontal layers;
patterning said photoresistive material using a photolithographic development process to form a lift-off mask of finite width defined by lateral edges and of finite depth defined by front and rear edges;
removing regions of said sequence of horizontal layers laterally and symmetrically disposed beyond lateral edges of said mask by an etching process; wherein
said regions are removed by use of an ion-beam etch (IBE) milling process directed downward along edges said mask and making an outwardly directed angle $\theta_2$ with a vertical direction, wherein said milling process penetrates at said angle through said layers 6d2, 6d3, 6f, and 6h of said sensor stack, stopping at layer 6d1, or minimally penetrating layer 6d1, thereby creating horizontally opposing lateral sides thereon.

41. The method of claim 40 wherein said angle $\theta_1$ is outwardly directed between 0° and 10° with the vertical producing laterally opposing sides that are substantially vertical and parallel.

42. The method of claim 41 wherein said patterning further comprises:
using a second IBE, directed horizontally at said laterally patterned sides already having an angle $\theta_1$ with a vertical, producing now an additional side trim of said laterally patterned sensor sides and creating outwardly sloping coplanar lateral sides at said angle to the vertical $\theta_1$ between approximately 15° and 45°.

43. The method of claim 33 wherein said width, w, is between approximately 30 and 70 nm.

44. The method of claim 33 wherein said depth, d, is between approximately 30 and 70 nm.

45. The method of claim 33 wherein said layer of insulation is an oxide layer that is formed using a process comprising an ion beam deposition of $Al_2O_3$ or MgO to a thickness between approximately 20 A and 50 A.

* * * * *